United States Patent [19]
Fang et al.

[11] Patent Number: 5,978,272
[45] Date of Patent: *Nov. 2, 1999

[54] NONVOLATILE MEMORY STRUCTURE FOR PROGRAMMABLE LOGIC DEVICES

[75] Inventors: Hao Fang, Cupertino; Sameer Haddad, San Jose; Nader Radjy, Palo Alto, all of Calif.

[73] Assignee: Advanced Micro Devices, Inc., Sunnyvale, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/871,589

[22] Filed: Jun. 6, 1997

Related U.S. Application Data

[63] Continuation of application No. 08/482,725, Jun. 7, 1995, abandoned.

[51] Int. Cl.[6] .................................................. G11C 11/34
[52] U.S. Cl. ................................. 365/185.27; 365/185.26
[58] Field of Search ......................... 365/185.01, 185.26, 365/185.27, 185.18; 257/288, 336, 344

[56] References Cited

U.S. PATENT DOCUMENTS 5,480,821  1/1996  Chang ................................. 365/185.26
5,659,504  8/1997  Bude et al. ......................... 365/185.18

*Primary Examiner*—A. Zarabian
*Attorney, Agent, or Firm*—Sawyer & Associates

[57] ABSTRACT

A nonvolatile memory structure is disclosed. The nonvolatile memory structure includes a substrate, a heavily doped drain junction disposed in the substrate, and a lightly doped source junction disposed in the substrate. The source junction is diffused more deeply than the drain junction. The nonvolatile memory structure also includes a gate structure. The gate structure has a floating gate capacitively coupled to the substrate and a control gate capacitively coupled to the floating gate. The heavily doped drain junction has a central portion proximate to the gate structure. The lightly doped source junction also has a central portion proximate to the gate structure. At least the central portion of the lightly doped source junction is more lightly doped than the central portion of the heavily doped drain junction.

6 Claims, 7 Drawing Sheets

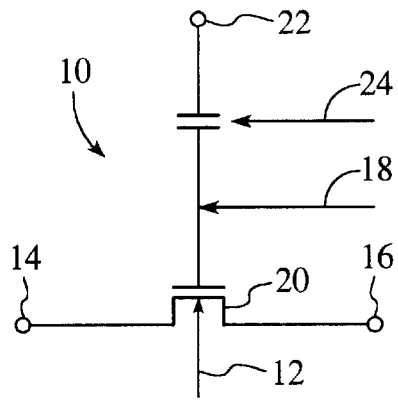
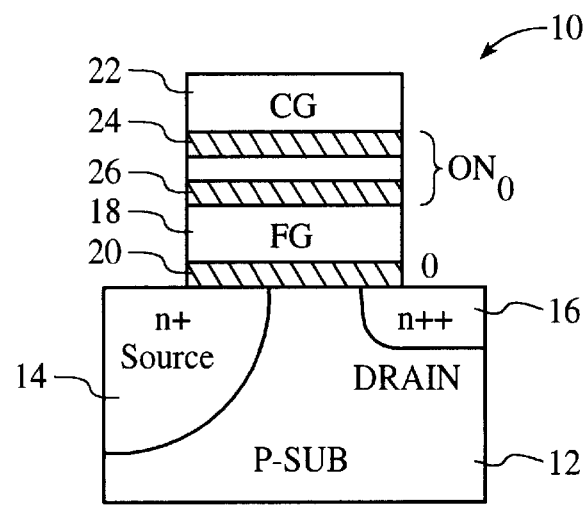
FIG. 1A     FIG. 1B
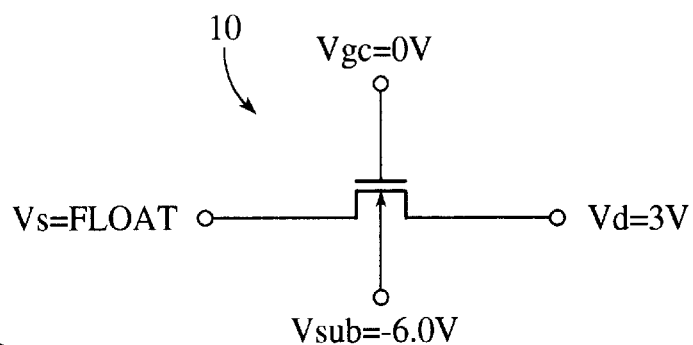
FIG. 2A
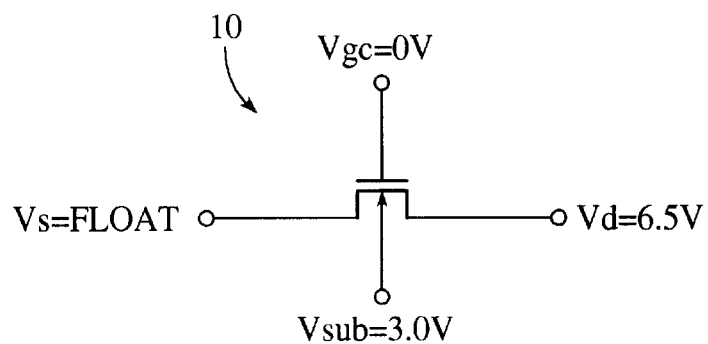
FIG. 2B

|  | SELECTED CELL | UNSELECTED (ERASED) CELLS ON SELECTED BL | UNSELECTED (ERASED) CELLS (OTHER BL) |
|---|---|---|---|
| PROGRAM: (BYTS) | $V_{sub}=-V_{jb}$<br>$V_s=$FLOATING<br>$V_d=0V$<br>$V_g=0V$ | $V_{sub}=-V_{jb}$<br>$V_s=$FLOATING<br>$V_d=0V$<br>$V_g=V_{jb}$ | $V_{sub}=-V_{jb}$<br>$V_s=$FLOATING<br>$V_d=-V_{jb}/2$ (or FLOATING)<br>$V_g=0V$ |
| ERASE: (BULK) | $V_{sub}=-V_{jb}$<br>$V_s=$FLOATING<br>$V_d=0V$<br>$V_g=V_{jb}$ | $V_{sub}=-V_{jb}$<br>$V_s=$FLOATING<br>$V_d=0V$<br>$V_g=V_{jb}$ | $V_{sub}=-V_{jb}V$<br>$V_s=$FLOATING<br>$V_d=-V_{jb}/2$(or FLOATING)<br>$V_g=0V$ |
| READ: (X) | $V_{sub}=0V$<br>$V_s=1V$<br>$V_d=0V$<br>$V_g=5V$ | $V_{sub}=0V$<br>$V_s=1V$<br>$V_d=0V$<br>$V_g=0V$ | $V_{sub}=0V$<br>$V_s=0V$<br>$V_d=0V$<br>$V_g=0V$ |

FIG. 5

BULK
PROGRAM: $V_{sub}=-V_{jb}$   $V_d=V_c=0$   $V_s=$FLOATING FOR ALL CELLS
READ: THE SAME AS BYTE PROGRAMS AND BULK ERASE XXX (SEE FIG. 7)
BYTS ERASE:
| SELECTED CELL | UNSELECTED (PROGRAMMED) CELL ON SELECTED BL | UNSELECTED (PROGRAMMED) CELLS (OR OTHER BLS) |
|---|---|---|
| $V_{sub}=-V_{jb}$ $V_d=0V$ $V_g=-V_{jb}$ | $V_{sub}=-V_{jb}$ $V_d=0V$ $V_g=0V$ | $V_{sub}=0V-V_{jb}$ $V_d=V_{jb}/2$ $V_g=-0V$ |
(FLOAT SOURCE FOR ALL BTES)
FIG. 7
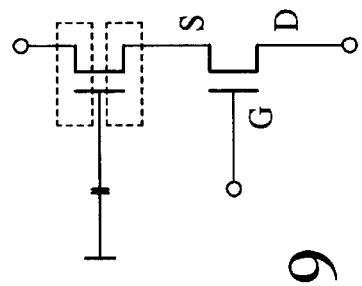
FIG. 9
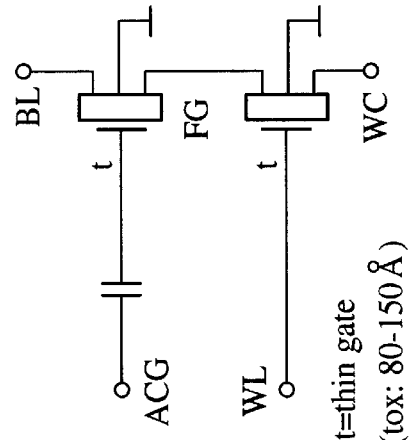
t=thin gate
(tox: 80-150 Å)
FIG. 10A

| Operation | ACG | BL | WL | WC | FG |
|---|---|---|---|---|---|
| Erase (bulk) | 0V | 8V | 0V | HiZ | -Ve |
| Program | 8V | 8V | 0V | HiZ | -Ve + $\Delta$Vp |
| Not Progr. | 0V | 8V | 0V | HiZ | -Ve - $\Delta$p |
| Not Progr. | 8V | 3.3V | 0V | HiZ | -Ve |
| Read | 3.3V | ground | 3.3V | 3.3V | -Ve (0V+$\Delta$Vp) |

Selected BLs → (Program, Not Progr. row 1)
Unselected BLs → (Not Progr. row 2)

$\Delta$p — Programming disturb; It should be less than 1V $\Delta$Vp — it will be in 3-8V range depending on programming time.
$\Delta$Vp ≅ 4V for tprog ≅ 10 $\mu$s

* Assumed that the Junction Breakdown Voltage is at 7.5V or below so that 8V operation is sufficient for junction breakdown.

FIG. 10B

NONVOLATILE MEMORY STRUCTURE FOR PROGRAMMABLE LOGIC DEVICES

This application is a continuation of application Ser. No. 08/482,725 filed on Jun. 7, 1995 now abandoned.

FIELD OF THE INVENTION

The present invention relates to the design, construction and fabrication of nonvolatile memory devices. More specifically, the present invention relates to the design and construction of electrically programmable and erasable memories commonly known as "Flash Memories" for programmable logic device applications.

BACKGROUND OF THE INVENTION

Conventional nonvolatile PROM (Programmable Read-Only Memory) memories can be divided into two classes: EPROMs (Electrically Programmable Read-Only Memories) and EEPROMs (Electrically Erasable/Programmable Read-Only Memories). EPROMs use channel hot electron injection for byte-programming, and apply ultraviolet light exposure for erase operations. EEPROMs generally employ Fowler-Nordheim (F-N) tunneling for both programming and erasing. Due to the small cell size and simple cell design and fabrication process, EPROMs can be produced with higher density and lower cost compared to EEPROMs. On the other hand, EEPROMs offer the capability of byte-erase as well as the convenience of in-system electrical reusability. Recently, the flash memory has gained significant attention as it promises to combine the advantages of EPROM density with EEPROM electrical erasability.

At present time, there are several approaches to flash memory technology. The multifarious designs sort themselves into two basic approaches, distinguished by whether they require one or two voltage supplies. Both can trace their lineage to EPROM technology, using a floating gate structure but with a thinner gate oxide. However, they differ in their cell structure as to whether they require one or several transistors per cell. In general, the one-transistor cell requires a 12 volt supply for programming and a 5 volt supply for reading, but yields a small cell size. This results in higher density, smaller chip size, and lower cost than the 5 volt only approach.

The self-aligned stacked-gate cell based on ETOX (EPROM Tunnel-Oxide) technology, is the typical for the one transistor school. There are three keys to ETOX cell operation: (1) a very high-quality oxide, (2) unique drain and source structure, optimized for program and erase operations respectively, and (3) the use of complementary, adaptive program and erase algorithms. This combination supports well-controlled erasure and reprogramming of the simple stacked-gate ETOX cell. One problem with the single-transistor cell, however, is the possibility of over-erasure and consequent current leakage, resulting in false data readings. This occurs when a cell in the zero state receives an erase pulse, whereby it can be driven into depletion mode. The column-sense amplifier can read this leakage current falsely as an erased cell.

The use of a truncated floating gate, or stepped-gate cell, also provides a flash EEPROM capability. The truncated floating gate's voltage must be accompanied by a select-gate voltage for turning on the cell. The programming operation and reading function are identical to those used in EPROM and ETOX flash cells. The stepped-gate structure's primary drawback is an electrical-stress-induced charge loss during programming known as "program disturb", whereby floating-gate charge is lost through the drain region of the cell. This and various other stresses are present with all floating-gate technologies and must be designed and processed out. Very tight stepped-gate process control can provide a sufficient "operating window", but in any case, electrical stresses are significant factors in cycle-related programming failures. Furthermore, the problem is exacerbated by slower programming, caused by a longer cell channels.

Another approach that automatically protects against over-erasure is to let the floating gate control only half of the channel and let the other half of the channel be controlled by the control gate. In this manner, the transistor would be off even if the floating gate is positively charged. Such a cell is known as a split-gate cell. However, the longer channel length results in somewhat longer programming times and/or higher bit-line voltage during programming and may increase the cell size.

The dual-power-supply requirements of most of conventional flash EEPROMs add cost and space penalties for system design, and for this reason, many innovative single-supply flash memory technologies have been developed. The advantage of these approaches in memory applications is that they can provide a significant cell area reduction without further stretching the device limits. However, the complicated fabrication steps involved with these cell structures may result in a loss of cost competitiveness in the memory market.

In summary, there are many routes to the design, construction, and fabrication of flash memories, including those described above. All the technologies trace their lineage to EPROM technology, using a floating-gate structure but with a thinner gate oxide. Each variation has its advantages and disadvantages, resulting from the tradeoff between cost and system requirements. As the combination of high density, low cost, and electrical reprogrammability makes flash EPROM a candidate for data storage, the combination of high density, low power, flexibility of fast bulk-erase and byte-program and/or bulk-program and byte-erase makes flash memory a good candidate for programmable logic devices.

Hence, there was a need in the art for a nonvolatile flash memory structure affording high speed programming and erasing operations as well as fast reading speed with low voltages and low power consumption.

SUMMARY OF THE INVENTION

The need in the art is addressed by the present invention which provides a novel nonvolatile flash memory structure. In a most general sense, the inventive structure includes a substrate having a heavily doped drain junction and a lightly doped source junction disposed therein. The structure further includes a gate structure with a floating gate capacitively coupled to the substrate and a control gate capacitively coupled to the floating gate. The inventive structure affords high speed programming and erasing operations with low voltages and low power consumption.

In a particular embodiment, the nonvolatile memory cell includes a p-substrate having embedded therein an n-type diffused drain region and an n+ source region, a floating gate coupled capacitively to the p-substrate through a tunnel oxide, or other gate dielectric such as nitrided oxide; and a control gate coupled capacitively to the floating gate through a oxide/nitride/oxide, or other type of inter-dielectric, film. The diffused drain region is formed of a shallowly diffused but heavily doped n⁺ junction, while the source region is formed of deeply diffused but lightly doped n-junction to minimize junction capacitance. Therefore, the speed can be improved. This is a particular advantage for PLD's. A relatively thin gate dielectric (e.g. oxide of 60~150 A thickness) is interposed between the top surface of the p-substrate and a conductive polysilicon floating gate. The polysilicon control gate is insulatively supported above the floating gate by an inter-dielectric layer of oxide/nitride/oxide film. A channel region in the p-substrate separates the drain region and the source region.

A new nonvolatile memory array is formed using cells of the present invention. In the array configuration, the source and drain junctions of each cell in a common column are connected together and the gate structures of each cell in a common row are connected together. The program and erase operations are performed on the drain side with floating sources, while the fast reading is done through the source side with grounded drains.

In addition to the method of fabricating the novel memory structures, the present teachings provide methods for programming, reading and erasing a single cell or a selected cell in an array or bulk cells in an array.

BRIEF DESCRIPTION OF THE DRAWINGS

FIG. 1a is a schematic diagram of the nonvolatile memory cell of the present invention.

FIG. 1b shows a cross-sectional view of a nonvolatile memory cell to be used for the present invention.

FIGS. 2a and 2b, respectively, show avalanche program and erase bias configurations of the memory cell of the present invention.

FIG. 5 is the bias configuration of the array for byte program, bulk erase, and read operations.

FIG. 7 is a table that lists the bulk program and byte erase operation modes of the array.

FIG. 9 is the proposed alternative cell structure for single polysilicon type of memory cells.

FIGS. 10a and 10b are examples of a proposed single poly memory cell with the bias positive configuration for programmable logic device applications.

DESCRIPTION OF THE INVENTION

Figure 2C:
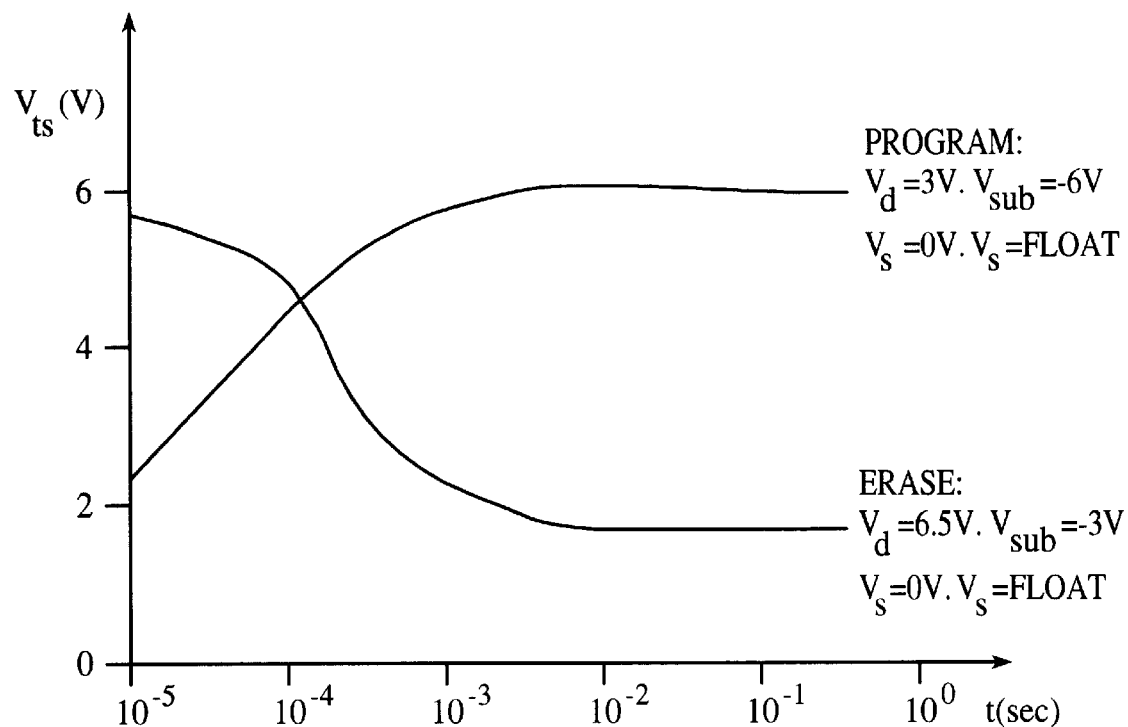
FIG. 2c shows the threshold voltage as a function of time for the program and erase bias configurations of FIGS. 2a and 2b, respectively.

Illustrative embodiments and exemplary applications will now be described with reference to the accompanying drawings to disclose the advantageous teachings of the present invention.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof.

The present invention utilizes the method disclosed in U.S. patent application entitled FLASH PROGRAMMING, Ser. No. 08/393,636, filed Mar. 24, 1995, by S. Haddad et al., the teachings of which are incorporated herein by reference, to form a high density, low program/erase voltage and current, and fast byte programming and bulk erase (or bulk programming and byte erase) and fast reading speed nonvolatile memory structure specially designed for programmable logic circuit applications.

FIG. 1a is a schematic diagram of the nonvolatile memory cell of the present invention. FIG. 1b shows a cross-sectional view of a nonvolatile memory cell to be used for the present invention. As illustrated in FIGS. 1a and 1b, the nonvolatile memory cell 10 of the present invention is formed of a p-substrate 12 having embedded therein an n+ source region 14, an n-type diffused drain region 16, a floating gate 18 coupled capacitively to the p-substrate 12 through a tunnel oxide 20, or other gate dielectric such as nitrided oxide; and a control gate 22 coupled capacitively to the floating gate 18 through a oxide/nitride/oxide, or other type of inter-dielectric, film 24, 26.

(It is to be understood that a large number of 1000 or more of such cells are typically grouped in form of a matrix and used as part of a single integrated circuit chip. An single external or off-chip low voltage (typically at +3.0 V) supply is supplied to such an integrated circuit chip.)

The diffused drain region 16 is formed of a shallowly diffused but heavily doped n-junction, while the source region 14 is formed of deeply diffused but lightly doped n-junction. The relatively thin gate dielectric 20 (i.e. oxide of 60~150 A thickness) is interposed between the top surface of the substrate 12 and the conductive polysilicon floating gate 18. The polysilicon control gate 22 is insulatively supported above the floating gate 18 by the inter-dielectric layer of oxide/nitride/oxide film 24 and 26. A channel region in the substrate 12 separates the source region 14 and the drain region 16.

The avalanche program and erase bias configurations of the memory cell are shown in FIGS. 2a and 2b respectively. To program, electron injection is effected from the drain side. In this case, the programming operation is accomplished by applying +3 V on the drain (Vd=3 V) and −6 V on the p-substrate (Vsub=−6 V) so as to shift upwardly the threshold voltage Vt by 4 volts in approximately 0.002 seconds.

To erase, holes are injected from the drain side. The erasing operation is achieved by applying +6.5 V on the drain (Vd=+6.5 V) and −3 V on the p-substrate (Vsub=−3 V) so as to shift downward the voltage threshold Vt by 4 volts in 0.002 seconds. See FIG. 2c which shows the threshold voltage as a function of time. It was found that both high speed byte (or bulk) programming (<10 $\mu$s) and avalanche erasing (<100 $\mu$s) could be easily achieved using a very low power supply (i.e. voltage less than 8.5 V and current less than 0.1 $\mu$A per cell) when the device was operated at junction avalanche breakdown region.

An advantage of using substrate biasing configuration is to suppress the hot hole injection, because (1) the location of the high field is away from the oxide silicon interface, (2) the magnitude of the maximum field is reduced by more than 50%, and (3) the vertical field does not favor hole injection.

Figure 3:
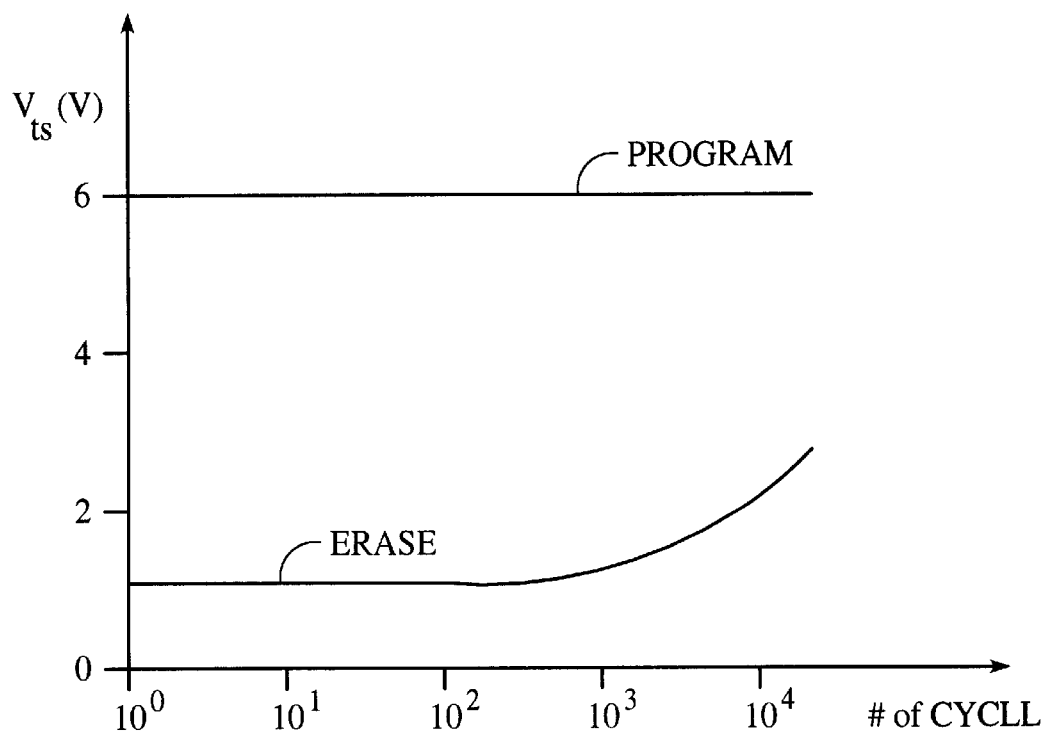
FIG. 3 illustrates the program/erase window closure due to hole injection.

FIG. 3 shows the program/erase window closure due to hole injection. The obtained endurance (>1000 cycle) is sufficient for PLD applications, where only a 100 cycle endurance is usually required for the memory cell.

Another advantage of this novel memory cell is that this avalanche hot carrier injection system is not sensitive to tunnel/oxide thickness. Therefore, a thicker oxide can be used to further improve product reliability and increase gate coupling. Meanwhile, a thicker oxide reduces gate capacitance which further increases reading speed. Also, by increasing oxide thickness the gate coupling ratio is improved and the supply voltage can be reduced with a trade-off between reducing Idsat and cell size for the single poly cell case.

The nonvolatile memory structure has a heavily doped drain and a lightly doped source junction as shown in FIG. 1b. By heavily doping the drain junction, a junction breakdown voltage, which will be essentially the program/erase voltage, can be reduced down to 5 V or below. Thus, programming and erasing can be operated at a very low supply voltage. Meanwhile, a lightly doped source can significantly reduce the junction capacitance and provide a fast read path (cell is read from source side with drain grounded) for PLD applications.

Figure 4:
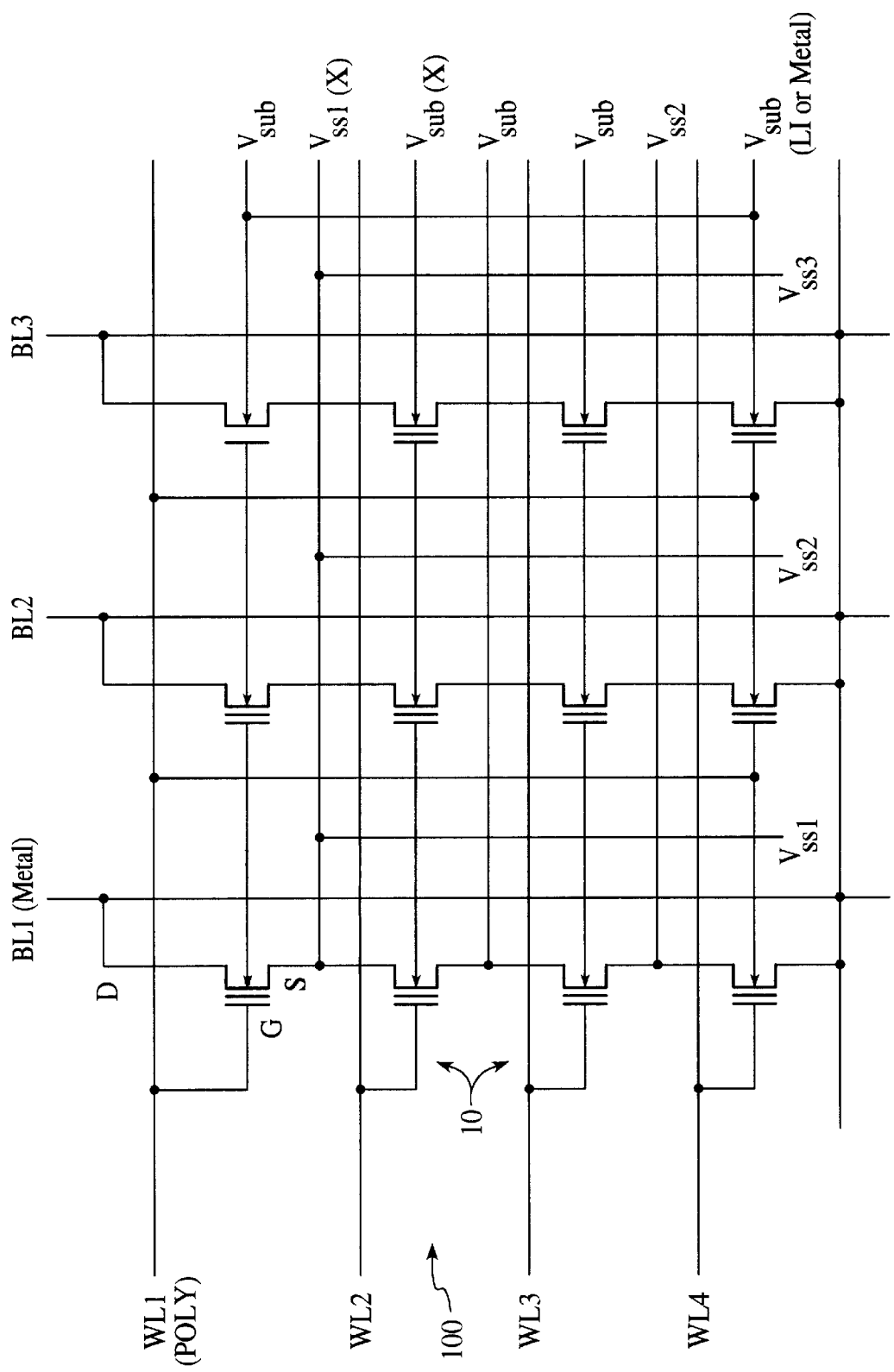
FIG. 4 is a schematic drawing of a high density, fast speed, and low power EEPROM array, using the proposed nonvolatile memory cell as shown in FIG. 1.

FIG. 4 is a schematic drawing of a high density, high speed, and low power EEPROM array, using the proposed nonvolatile memory cell as shown in FIG. 1a. The array 100 is formed of a plurality of memory cells 10 in the form of a matrix of N rows and M columns. The peripheral circuitry on the device includes conventional row address decoder, column address decoder, sense amplifier circuitry, and input/output buffer circuitry which have been purposely omitted for the sake of clarity.

It can be seen that the drains of the cells in the same column are connected together to a shared bitline connectable to the column address decoder (not shown); the gates of the cells in the same rows are connected together to a shared wordline. The source nodes for different cells are connected together using a common Vss n+-diffusion region in the wordline direction for a small die size or more favorably by using local interconnect Vss lines to minimize the source line resistance and capacitance for both high speed and density, or using metal lines through via pick-up in the bitline direction to further reduce the source line resistance and improve the speed. If a local interconnect for bitline and a metal for Vss are used to connect memory device drain and source nodes respectively, the cell pitch in the wordline direction will be the same size as the conventional metal bitline. The new cell is of the present invention size can be the same as the conventional NVM cell with an improved read speed path.

The program and erase operations are performed on the drain side with floating sources, while the fast reading is done through the source side with grounded drains. Specifically, due to the common source lead in the array shown in FIG. 4, erasing of the cells can be done on a whole array or a number of sectors (bulk erase) by applying a negative voltage to all of the wordlines of the cells desired to be erased from the row address decoder (not shown) and substrate as shown in FIG. 5. At the same time, a common source lead is floating.

Programming of the cells can be performed on a byte-by-byte basis (smaller segments of rows can be selectively programmed as desired) by applying a negative voltage to the p-substrates of the cells desired to be programmed by way of the common substrate lead Vsub. Simultaneously, the wordlines containing the selected bytes to be programmed would be held to a ground potential. Also, the bitlines containing the selected bytes to be programmed would likewise be held to a ground potential as shown in FIG. 5.

Corresponding to the new nonvolatile memory array shown in FIG. 4, the byte programming, bulk avalanche erase and read bias configurations for the selected cells, unselected cells on the selected bitline, and cells on the unselected bitlines are listed in FIG. 5, in which the symbol Vjb is the value of drain junction breakdown voltage plus a 0.3 V margin, and it can be in a range from 3.5 V to 9 V depending on the drain junction engineering for a given technology. The low limit value of Vjb is the voltage required to generate hot electrons and holes via impact ionization and satisfy hot carrier injection into floating gate.

Figure 6:
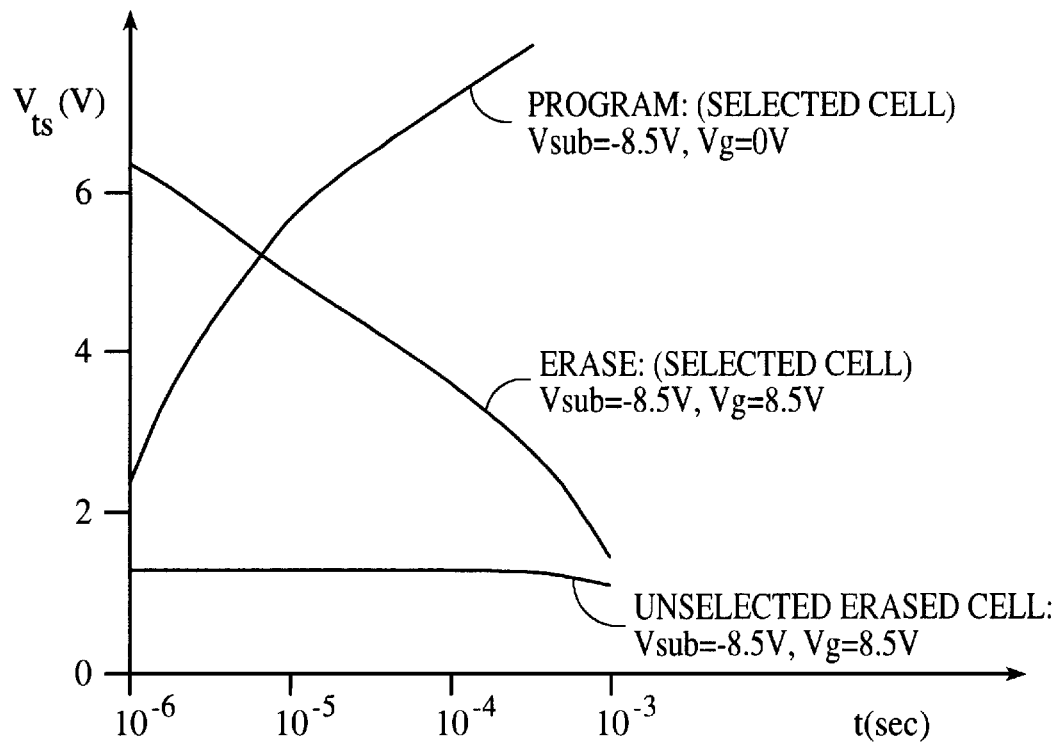
FIG. 6 shows the disturbance of the threshold voltages of an erased but, unselected flash memory cell on the selected bitline of the array during high speed program/erase.

The byte programming is achieved by biasing control gates of unselected cells on the selected bitline with the same negative potential as the p-substrate to eliminate the vertical field for charging floating gate via hot-carrier injection. Based on the experimental results indicated in FIG. 6, the unselected erased cells on the selected bitline will not be disturbed during programming or erasing. For the cells on unselected bitlines, a voltage of −Vjb/2 on the bitline is sufficient to suppress the junction breakdown. The bulk programming and byte avalanche erase mode can be also done in a similar way as demonstrated in FIG. 7. During program and erase for both operation/modes, current limit devices are used to control the avalanche current, and they can be turned on and off through external select transistors outside of the memory cell.

Figure 8:
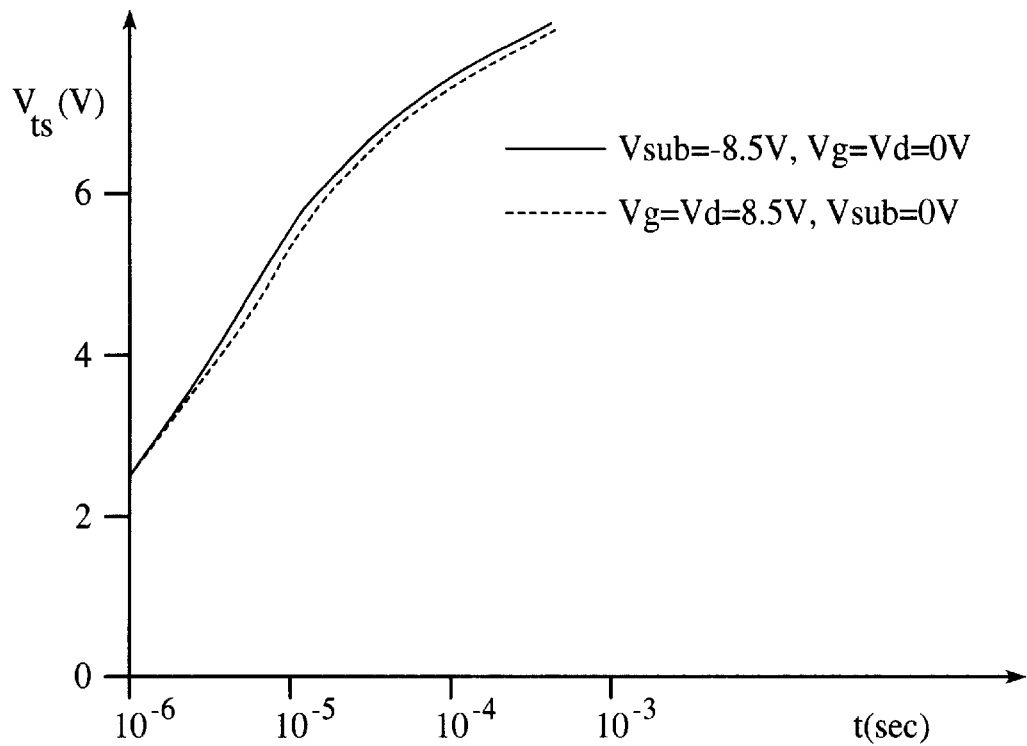
FIG. 8 is the experimental result of program characteristics for two bias configuration (i.e. positive and negative power supplies).

An alternative bias configuration for both operation/modes is to raise all the biases at different cell nodes with a positive value (the same amplitude as the bulk bias) but keeping bulk potential at zero volt as indicated in FIG. 7. This configuration can ease the requirement for the negative charge pump. The experimental result shown in FIG. 8 confirms that the memory cell has the same programming characteristics as the negative bulk bias configuration.

Furthermore, there is an added advantage that the cell can be constructed with a single polysilicon layer, namely the floating gate. Here, the control gate is replaced with a diffusion region, which was used in many existing simple and low-cost polysilicon EEPROM cells for programmable logic applications. The control gate can be switched between 0 V and Vcc to select and deselect the cell during the read period, and between Vjb and 0 V to program and erase the cells as suggested above. The disadvantage is that the added diffusion capacitance slows down the read access time. This can be overcome again by using the conventional means of adding a select transistor at the source side as indicated in FIG. 9 to enable fast read. In this operation, the gate of the added select transistor is set at <=0 V during programming and erasing, and at Vg=Vcc with Vd<=Vcc and Vdm 0 V via turning on the memory cell (Vcg=Vcc) for the read period. (Wherein Vd is the drain voltage for the select transistor and Vdm is the drain voltage for the memory transistor). The advantage here is that the cell size will be decreased in comparison to a conventional single poly memory cell for PLD due to the addition of an extra select transistor, a diffusion region as the control gate, and an extra wordline for select transistors. However, it also makes the cell floating gate fabrication process substantially simplified. Refer to FIG. 10b for the bias configuration for the single poly cell of FIG. 10a.

Thus, the combination of two optional bias configurations and two optional operation modes (byte program/bulk erase or bulk program/byte erase) expands the flexibility of using this new memory structure for various device and circuit applications.

Another alternative in constructing the new nonvolatile memory structure is to build the whole memory array either inside a triple well or an isolated p-well on an n-substrate, so that basing the memory cell is more flexible without impacting the well potential for peripheral devices in the same chip. The bulk or well isolation can be easily formed as well by using the conventional LOCOS isolation technique on a SOI substrate.

Thus, the present invention has been described herein with reference to a particular embodiment for a particular application. Those having ordinary skill in the art and access to the present teachings will recognize additional modifications applications and embodiments within the scope thereof. For example, combining programmable elements and circuit blocks logically leads to some form of wafer-scale integration. The same combination may also be required to physically construct neural network computers. It is therefore intended by the appended claims to cover any and all such applications, modifications and embodiments within the scope of the present invention.

We claim:

1. A nonvolatile memory structure comprising:

a substrate;

a heavily doped drain junction disposed in the substrate;

a lightly doped source junction disposed in the substrate wherein the source junction is diffused more deeply than the drain junction; and a gate structure including:

a floating gate capacitively coupled to the substrate and a control gate capacitively coupled to the floating gate;

wherein the lightly doped source junction is more lightly doped than the heavily doped drain junction.

2. The nonvolatile memory structure of claim 1 wherein the substrate is a p type substrate.

3. The nonvolatile memory structure of claim 2 wherein the floating gate is coupled to the substrate through a first dielectric.

4. The nonvolatile memory structure of claim 3 wherein the control gate is coupled to the substrate through a second dielectric.

5. The nonvolatile memory structure of claim 4 wherein the gate structure a self-aligned stacked-gate cell.

6. The memory structure of claim 1, wherein a drain junction breakdown voltage is no greater than approximately 5 volts.

* * * * *